(12) United States Patent
Natori

(10) Patent No.: US 8,848,073 B2
(45) Date of Patent: Sep. 30, 2014

(54) SOLID-STATE IMAGING DEVICE AND ELECTRONIC APPARATUS

(75) Inventor: Taichi Natori, Kanagawa (JP)

(73) Assignee: Sony Corporation, Tokyo (JP)

( * ) Notice: Subject to any disclaimer, the term of this patent is extended or adjusted under 35 U.S.C. 154(b) by 127 days.

(21) Appl. No.: 12/850,347

(22) Filed: Aug. 4, 2010

(65) Prior Publication Data

US 2011/0063481 A1     Mar. 17, 2011

(30) Foreign Application Priority Data

Sep. 16, 2009   (JP) ................................. 2009-214819

(51) Int. Cl.
*H04N 9/04*        (2006.01)

(52) U.S. Cl.
CPC .......... *H04N 9/045* (2013.01); *H04N 2209/045* (2013.01)
USPC ........... 348/273; 348/272; 348/276; 348/277; 348/280

(58) Field of Classification Search
None
See application file for complete search history.

(56) References Cited

U.S. PATENT DOCUMENTS

| 6,965,406 | B1 * | 11/2005 | Ueda et al. ..................... 348/252 |
| 2005/0212934 | A1 * | 9/2005 | Hoshuyama .................. 348/272 |
| 2007/0076113 | A1 * | 4/2007 | Tamaru et al. ........... 348/333.01 |

FOREIGN PATENT DOCUMENTS

| JP | 2003-199117 | | 7/2003 |
| JP | 2004-056568 | | 2/2004 |
| JP | 2008-020594 | | 1/2008 |
| JP | 2008-078922 | | 4/2008 |
| JP | 2008205940 A | * | 9/2008 |
| JP | 2008-236620 | | 10/2008 |
| JP | 2009-158689 | | 7/2009 |

* cited by examiner

*Primary Examiner* — James Hannett
*Assistant Examiner* — Yih-Sien Kao
(74) *Attorney, Agent, or Firm* — Robert J. Depke; The Chicago Technology Law Group, LLC

(57) ABSTRACT

A solid-state imaging device includes: an R pixel provided with an R filter for transmitting red-color light; a B pixel provided with a B filter for transmitting blue-color light; an S1 pixel which is provided with an S1 filter with a visible light transmittance independent of wavelengths in a visible light region and has a sensitivity higher than that of the R pixel; and an S2 pixel which is provided with an S2 filter with a visible light transmittance independent of wavelengths in the visible light region and lower than the visible light transmittance of the S1 filter and has a sensitivity lower than the sensitivity of the S1 pixel.

11 Claims, 6 Drawing Sheets

F I G . 2
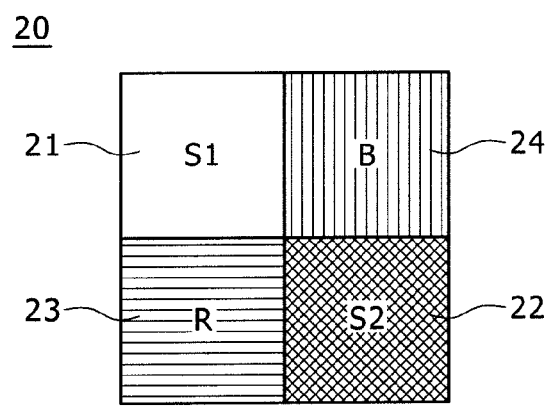
F I G . 3
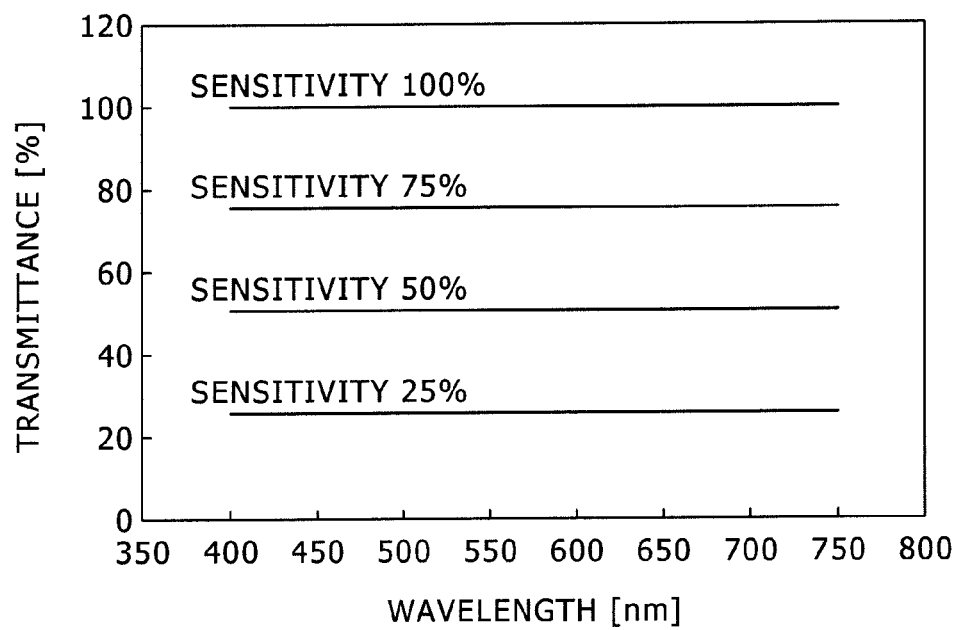

SOLID-STATE IMAGING DEVICE AND ELECTRONIC APPARATUS

The present application claims priority to Japanese Patent Application JP 2009-214819 filed in the Japanese Patent Office on Sep. 16, 2009, the entire content of which is hereby incorporated by reference.

BACKGROUND OF THE INVENTION

1. Field of the Invention

The present invention relates to a solid-state imaging device employing a filter and relates to an electronic apparatus such as a digital-still camera and a video camera which employ the solid-state imaging device.

2. Description of the Related Art

In recent years, the miniaturization of the size of a pixel used in a solid-state imaging device has been making progress in order to allow the number of pixels used in the solid-state imaging device to be increased. Accompanying the miniaturization of the size of the pixel, an area occupied by the pixel also decreases so that the quantity of light incident on the pixel also becomes smaller as well. In addition, since an area occupied by a photodiode employed in the pixel also becomes narrow, the number of photons accumulated in the photodiode also becomes smaller as well and sensitivity deteriorates. Thus, the magnitude of a saturated signal generated in a saturated state of the pixel decreases as well. The sensitivity of a pixel employed in a solid-state image taking device is defined as the ratio of the magnitude of a signal generated by the pixel due to light incident on the pixel to the quantity of the incident light as will be explained later by referring to a diagram of FIG. 4. A high sensitivity of a pixel employed in a solid-state image taking device gives rise to a decrease in dynamic range as will be described later by referring to diagrams of FIGS. 4 and 9. That is to say, a high ratio of the magnitude of a signal generated by a pixel due light incident on the pixel to the quantity of the incident light results in a decrease in dynamic range.

In general, in comparison with a camera making use of a silver salt film, a digital-still or video camera employing a solid-state imaging device has a narrow dynamic range. The dynamic range is a brightness range in which an image can be taken without causing white and black failures. However, a monitoring camera is demanded to be capable of taking an image throughout a range from a dark place to a bright place. In addition, a monitoring camera is even demanded to be also capable of taking an image also at a dark place without causing a failure.

The dynamic range of a camera employing a solid-state imaging device is normally determined by a pixel which has the highest sensitivity. In a camera employing a solid-state imaging device having filters of elementary colors such as the G (green), R (red) and B (blue) colors for example, the dynamic range D of the G (green) pixel having the highest sensitivity normally determines the dynamic range of the camera. In the case of a solid-state imaging device having a saturated signal magnitude which is uniform for all pixels, a pixel having a highest sensitivity is the first pixel with its output signal attaining the magnitude of the saturated signal at an earliest time. This is because the pixel having the highest sensitivity is a pixel with a filter having the highest transmittance (that is, a filter transmitting a largest quantity of light) so that a largest number of protons are accumulated in a photo diode included in the pixel, causing a signal output by the pixel to attain the magnitude of the saturated signal at an earliest time.

There has been proposed an existing technology for improving the sensitivity of the solid-state imaging device. In accordance with the proposed existing technology, GRB (Green, Red and Blue) pixels of a Bayer array including a layout of filters of elementary colors (that is, the GRB colors) are used as pixels of a YRB array by making use of a Y pixel including a filter not absorbing light with visible wavelengths as a substitute for the G pixel. In addition, there has also been proposed another existing technology for improving the sensitivity of the solid-state imaging device. In accordance with the other proposed existing technology, one of G pixels placed in a checker board state in the Bayer array is replaced by the Y pixel described above. For more information on the existing technologies for improving the sensitivity of the solid-state imaging device, the reader is advised to refer to documents such as Japanese Patent Laid-open No. 2008-205940.

In the mean time, there has been proposed a existing technology for widening the dynamic range. In accordance with this proposed existing technology, two images are synthesized. The two images are a high-sensitivity image and a low-sensitivity image which have brightness levels different from each other. For more information on the existing technology for widening the dynamic range, the reader is advised to refer to documents such as Japanese Patent Laid-open No. 2004-56568.

SUMMARY OF THE INVENTION

For the same output-signal magnitude, however, the quantity of light incident on a photodiode in each of the aforementioned Y pixels including a layout of filters not absorbing light at visible wavelengths is smaller than the quantity of light incident on a photodiode in each of the GRB pixels.

To put it in detail, the quantity of light incident on a pixel is represented by the horizontal axis whereas the magnitude of an electrical signal generated by the pixel is represented by the vertical axis. As shown in the diagram of FIG. 9, the Y pixel attains a saturation point at an incident light quantity smaller than those of the GRB pixels. Thus, the dynamic range D (Y) of a solid-state imaging device employing Y pixels is narrower than the dynamic range D of a solid-state imaging device employing ordinary GRB pixels.

The dynamic range D (Y) of a solid-state imaging device employing Y pixels can be widened by suppressing the quantity of light incident on each of the Y pixels. If the quantity of light incident on each of the Y pixels is suppressed, however, the magnitude of a signal output by each of the Y pixels decreases so that the sensitivity of the solid-state imaging device employing the Y pixels deteriorates.

In addition, in accordance with the existing technology proposed as a technology for widening, two images are synthesized. The two images are a high-sensitivity image and a low-sensitivity image which have brightness levels different from each other. It is thus necessary to acquire the two images as a high-sensitivity image and a low-sensitivity image which have brightness levels different from each other. As a method for acquiring the two images as a high-sensitivity image and a low-sensitivity image which have brightness levels different from each other, it is possible to typically make use of two cameras with different sensitivities or one camera in two different exposure operations obtained by changing the exposure time.

If two cameras with different sensitivities are used, however, images must be taken by aligning the two cameras. Thus, the positions of the two images to be taken are shifted from each other. In addition, in accordance with the method of making use of one camera in two different exposure operations obtained by changing the exposure time, the two different exposure operations are carried out so that a time difference is generated between the two images.

On top of that, there have been also proposed a solid-state imaging device employing pixels with different sensitivities and a solid-state imaging device having every pixel provided with an embedded high-sensitivity sensor as well as an embedded low-sensitivity sensor. However, it is difficult to carry out a stable process of manufacturing these solid-state imaging devices which include low-sensitivity pixels and high-sensitivity pixels. In addition, due to the complicated structures of the solid-state imaging devices, it is difficult to keep up with smaller pixel sizes.

Addressing the problems described above, inventors of embodiments of the present invention have presented a solid-state imaging device which is capable of keeping up with smaller pixel sizes and increasing the sensitivity as well as the dynamic range.

A solid-state imaging device provided by embodiments of the present invention has an R pixel provided with an R filter for transmitting red-color light and a B pixel provided with a B filter for transmitting blue-color light. In addition, the solid-state imaging device also includes an S1 pixel which is provided with an S1 filter with a visible light transmittance independent of wavelengths in a visible light region and has a sensitivity higher than that of the R pixel. On top of that, the solid-state imaging device also includes an S2 pixel which is provided with an S2 filter with a visible light transmittance independent of wavelengths in the visible light region and lower than that of the S1 filter and has a sensitivity lower than that of the S1 pixel.

In addition, an electronic apparatus provided by embodiments of the present invention employs the solid-state imaging device having the configuration described above, an optical system for guiding incident light to an imaging section employed in the solid-state imaging device and a signal processing circuit for processing a signal output by the solid-state imaging device.

In accordance with embodiments of the present invention, the solid-state imaging device includes an S1 pixel which is provided with an S1 filter with a transmittance independent of wavelengths in a visible light region and has a sensitivity higher than that of the R pixel. On top of that, the solid-state imaging device also includes an S2 pixel which has a sensitivity lower than that of the S1 pixel. Thus, a solid-state imaging device having a high sensitivity can be implemented. In addition, by providing the RBS1 and RBS2 pixels as described above, one solid-state imaging device can be used for simultaneously taking two images, that is, a low-sensitivity image and a high-sensitivity image which have different levels of brightness. Then, by synthesizing the two images, that is, a low-sensitivity image and a high-sensitivity image which have different levels of brightness, it is possible to take an image with a wide dynamic range.

On top of that, the layout of filters can be changed from that of the existing Bayer array. It is thus possible to eliminate barriers to miniaturization of the solid-state imaging device.

In addition, the electronic apparatus according to the present invention employs the solid-state imaging device described above. It is thus possible to take an image at a high sensitivity and a wide dynamic range.

In accordance with embodiments of the present invention, it is possible to provide a solid-state imaging device and an electronic apparatus which are capable of keeping up with miniaturizations and taking an image at a high sensitivity and a wide dynamic range.

BRIEF DESCRIPTION OF THE DRAWINGS

FIG. 2 is a diagram showing an embodiment implementing a layout of filters each provided on one of pixels in a pixel section employed in the solid-state imaging device provided by embodiments of the present invention;

FIG. 3 is a diagram showing relations between the wavelength of light incident on S1 and S2 filters of the solid-state imaging device provided by embodiments of the present invention and the transmittances of the filters as well as relations between the wavelength of the light and the pixel sensitivity;

DETAILED DESCRIPTION OF THE PREFERRED EMBODIMENTS

Preferred embodiments of the present invention are explained in chapters which are arranged in an order shown below. It is to be noted, however, that implementations of the present invention are by no means limited to the embodiments.

1: Embodiment of the Solid-State Imaging Device
2: Embodiment of a Pixel Array and a Filter Array in the Solid-State Imaging Device
3: Embodiment of Processing of a Signal Output by the Solid-State Imaging Device
4: Other Embodiments of Semiconductor Devices 1: Embodiment of the Solid-State Imaging Device
Typical Rough Configuration of the Solid-State Imaging Device A concrete embodiment of the solid-state imaging device provided by the present invention is explained.

Figure 1:
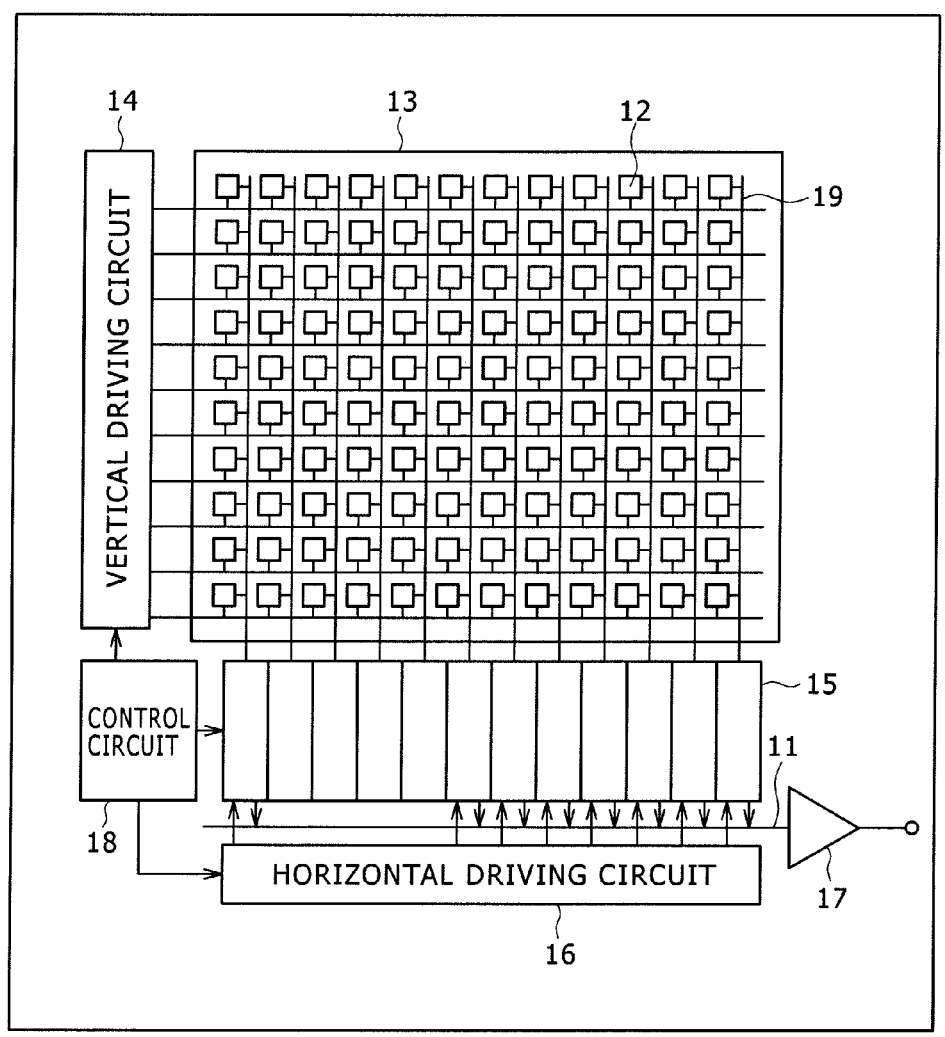
FIG. 1 is a block diagram showing a rough configuration of an embodiment implementing a solid-state imaging device provided by embodiments of the present invention.

FIG. 1 is a block diagram showing a rough configuration of an embodiment implementing a solid-state imaging device 10 provided by the present embodiments. A typical example of the solid-state imaging device 10 provided by the present embodiments is a solid-state imaging device of the MOS (Metal Oxide Semiconductor) type. In the following description, the solid-state imaging device of the MOS type is also referred to as a MOS image sensor.

The solid-state imaging device 10 shown in the block diagram of FIG. 1 has a pixel section 13 and a peripheral circuit section. The pixel section 13 includes a plurality of pixels 12 which are laid out regularly to form a two-dimensional matrix on a substrate such as a silicon substrate. The pixel section 13 is the so-called imaging area. Each of the pixels 12 has a photodiode which serves as an opto-electrical conversion element for converting light incident on the pixel 12 into an electrical signal. In addition to the photodiode, each of the pixels 12 also includes a plurality of pixel transistors which are each typically implemented as the so-called MOS transistor.

Typically, each of the pixels 12 can be configured to have three pixel MOS transistors, i.e., a transport transistor, a reset transistor and an amplification transistor. As an alternative, each of the pixels 12 can be configured to employ four pixel MOS transistors, i.e., the transport transistor, the reset transistor, the amplification transistor and a select transistor.

The peripheral circuit section is configured to have a vertical driving circuit 14, column-signal processing circuits 15, a horizontal driving circuit 16, an output circuit 17 and a control circuit 18.

The control circuit 18 is a circuit for generating clock signals and control signals on the basis of a vertical synchronization clock signal, a horizontal synchronization clock signal and a master clock signal. The control circuit 18 supplies the clock and control signals to other circuits such as the vertical driving circuit 14, the column-signal processing circuits 15 and the horizontal driving circuit 16.

The vertical driving circuit 14 is typically a shift register. The vertical driving circuit 14 is a circuit for sequentially scanning the pixel section 13 in the vertical direction in order to select pixels 12 in row units. The vertical driving circuit 14 supplies a pixel signal to the column-signal processing circuit 15 through a vertical signal line 19. The pixel signal is based on signal electric charge generated by the opto-electrical conversion element employed in a selected pixel 12 in accordance with the quantity of light incident on the opto-electrical conversion element.

The column-signal processing circuit 15 is provided typically for every column of the matrix of pixels 12. The column-signal processing circuit 15 is a circuit for carrying out signal processing including a process to eliminate noises from a signal output by pixels 12 in accordance with a signal which is output by a black reference pixel for every matrix column. The black reference pixels are pixels created at locations surrounding the effective pixel area. That is to say, the column-signal processing circuit 15 carries out signal processing including a CDS (Correlated Double Sampling) process and signal amplification. The CDS process is a process of eliminating fixed pattern noises peculiar to the pixels 12. A horizontal select switch is connected between the output stage of the column-signal processing circuit 15 and a horizontal signal line 11. It is to be noted that the horizontal select switch itself is not shown in the block diagram of FIG. 1.

The horizontal driving circuit 16 is typically a shift register too. The horizontal driving circuit 16 is a circuit for sequentially outputting horizontal scanning pulses for sequentially selecting one of the column-signal processing circuits 15. The horizontal driving circuit 16 sequentially outputs pixel signals each generated by the selected column-signal processing circuit 15 to the horizontal signal line 11.

The output circuit 17 is a circuit for sequentially carrying out signal processing on the pixel signals which are each supplied by the selected column-signal processing circuit 15 to the output circuit 17 through the horizontal signal line 11.

If the solid-state imaging device 10 described above is used as a solid-state imaging device of the rear surface radiation type, a plurality of wiring layers are not provided on the rear surface on the light incidence surface side, that is, the so-called light receiving surface side. Instead, the wiring layers are created on the front surface side opposite to the light receiving surface side.

Typical Configurations of a Filter Array and a Pixel Array

Next, the following description explains a layout 20 of filters each provided for one of pixels in a pixel section employed in the solid-state imaging device provided by the present embodiments.

FIG. 2 is a diagram showing an embodiment implementing a layout 20 of filters each provided for one of pixels in a pixel section employed in the solid-state imaging device provided by the present embodiments.

As shown in the diagram of FIG. 2, an array 20 of filters each provided for one of pixels in a pixel section employed in the solid-state imaging device provided by the present embodiments has four pixels which are laid out on two rows and two columns. This array of filters each provided for one of pixels is repeated throughout the pixel section 13. The four pixels are an S1 pixel 21, an S2 pixel 22, an R pixel 23 and a B pixel 24.

The R pixel 23 has an R filter for transmitting red-color light whereas the B pixel 24 has a B filter for transmitting blue-color light.

The S1 pixel 21 is provided with an S1 filter with a constant transmittance which is independent of wavelengths of the light incident on the S1 filter. On the other hand, the S2 pixel 22 is provided with an S2 filter with a constant transmittance which is independent of wavelengths of the light incident on the S2 filter and lower than the transmittance of the S1 filter.

The array 20 shown in the diagram of FIG. 2 is obtained by replacing the G (green) pixels of the GRB (green, red and blue) pixels in the Bayer array with the S1 pixel 21 and the S2 pixel 22.

The following description explains the characteristic of the S1 filter serving as a filter provided for the S1 pixel 21 and the characteristic of the S2 filter serving as a filter provided for the S2 pixel 22. The horizontal axis of the diagram of FIG. 3 represents the wavelength of light incident on the pixel. The wavelength of light incident on the pixel is expressed in terms of nanometers. On the other hand, the vertical axis of the diagram of FIG. 3 represents the transmittances of the S1 and S2 filters provided for the S1 pixel 21 and the S2 pixel 22 respectively. In addition, the diagram of FIG. 3 is also a diagram showing relations between the wavelength of light incident on the S1 and S2 filters provided for respectively the S1 pixel 21 and the S2 pixel 22 and the pixel sensitivity for the different transmittances of the filters. That is to say, a relation between the transmittances of the S1 and S2 filters and the wavelength of the incident wavelength is provided for every pixel sensitivity which is defined as the ratio of the magnitude of a signal generated by a pixel due to a quantity of light incident on the pixel to the quantity of the light.

In order to make the following explanation simple, the spectral sensitivity characteristic of the solid-state imaging device itself is not taken into consideration. Since each of the S1 filter and the S2 filter transmits incident light for all wavelengths, the sensitivities of the S1 pixel 21 and the S2 pixel 22 are the same as the transmittances of the S1 filter and the S2 filter respectively. Thus, if the transmittances of the S1 filter and the S2 filter are 100%, the sensitivities of the S1 pixel 21 and the S2 pixel 22 provided with respectively the S1 filter and the S2 filter of 100% are also 100%. In addition, the sensitivities of the S1 pixel 21 and the S2 pixel 22 are a fixed value determined by the transmittances of the S1 filter and the S2 filter respectively for all the wavelengths of the light incident on the S1 pixel 21 and the S2 pixel 22 respectively.

By the same token, if the transmittances of the S1 filter and the S2 filter are 75%, the sensitivities of the S1 pixel 21 and the S2 pixel 22 provided with respectively the S1 filter and the S2 filter of 75% are also 75%. In the same way, if the transmittances of the S1 filter and the S2 filter are 50%, the sensitivities of the S1 pixel 21 and the S2 pixel 22 provided with respectively the S1 filter and the S2 filter of 50% are also 50%. Likewise, if the transmittances of the S1 filter and the S2 filter are 25%, the sensitivities of the S1 pixel 21 and the S2 pixel 22 provided with respectively the S1 filter and the S2 filter of 25% are also 25%.

As is obvious from the above description, by adjusting the transmittances of the S1 filter and the S2 filter are adjusted, each of the sensitivities of the S1 pixel 21 and the S2 pixel 22 provided with respectively the S1 filter and the S2 filter can be set at a desired value. In addition, even if the spectral sensitivity characteristic of the solid-state imaging device itself is taken into consideration, the sensitivities of the S1 pixel 21 and the S2 pixel 22 as well as the transmittances of the S1 filter and the S2 filter can be treated in the same way as described above with the only exception that the sensitivities of the S1 pixel 21 and the S2 pixel 22 as well as the transmittances of the S1 filter and the S2 filter are dependent on the wavelength of the light incident on the S1 pixel 21 and the S2 pixel 22 respectively.

Each of the S1 filter and the S2 filter transmits light of all wavelengths in the visible light region. The S1 filter and the S2 filter are created on the S1 pixel 21 and the S2 pixel 22 respectively by adoption of typically a vaporization technique applied to a metal having a metal-film thickness that generates a desired spectrum. Typical examples of the metal are the aluminum, the mercury and the rhodium. As an alternative, a material is made by dispersing carbon black in resin at a concentration generating a desired spectrum and, then, the material is applied to the S1 pixel 21 and the S2 pixel 22. The R and B filters are created by adoption of a commonly known technique. To be more specific, each of the R and B filters is created by applying a material to the pixel associated with the filter.

If resin containing carbon black is used for creating a filter, the resin is provided with an optical sensitivity characteristic. In this way, each of the S1 filter and the S2 filter can be created by adoption of the lithography technique. As a result, a pixel section having the configuration described above can be configured with ease by adoption of a existing technique.

Figure 4:
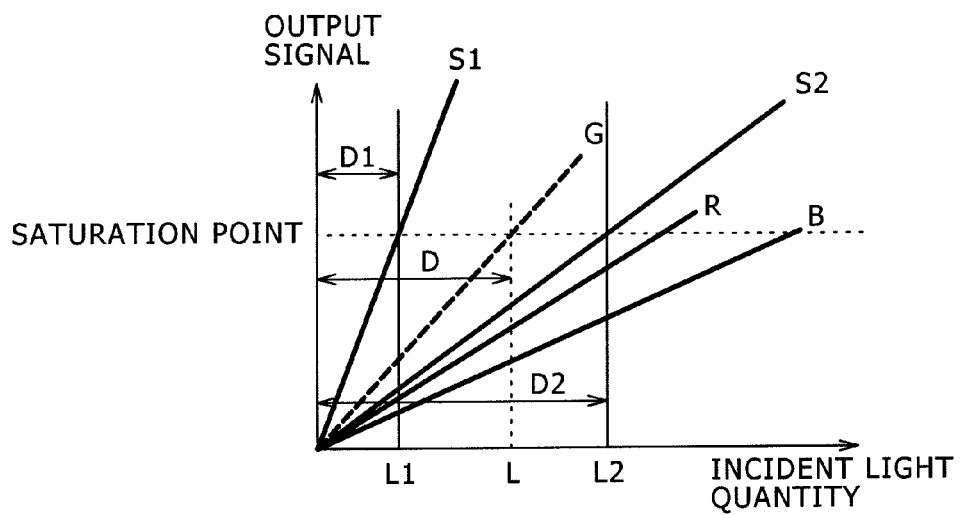
FIG. 4 is a diagram showing relations between the quantity of light incident on each pixel of the solid-state imaging device provided by embodiments of the present invention and the magnitude of a signal output by the pixel as well as relations between the saturation point and the dynamic range.

Relation Between the Quantity of Light Incident on a Pixel and the Output Signal of the Pixel FIG. 4 is a diagram showing relations between the quantity of light incident on R, B, S1 and S2 pixels and the magnitude of a signal output by each of the pixels. In the diagram of FIG. 4, the vertical axis represents the magnitude of a signal output by each of the R, B, S1 and S2 pixels whereas the horizontal axis represents the quantity of light incident on each of the pixels. Thus, each line shown in the diagram of FIG. 4 represents the relation between the quantity of light incident on a particular one of R, B, S1 and S2 pixels and the magnitude of a signal output by the particular pixel.

As described before, the solid-state imaging device employs four different filters, i.e., the R filter for the R pixel, the B filter for the B pixel, the S1 filter for the S1 pixel and the S2 filter for the S2 pixel.

In such a solid-state imaging device, the transmittance of the S1 filter, the transmittance of the R filter and the transmittance of the B filter are adjusted so that the sensitivity of the S1 pixel is higher than the sensitivity of the R pixel. In addition, the transmittance of the S2 filter is adjusted so that the sensitivity of the S2 pixel is lower than the sensitivity of the S1 pixel.

A dashed line G shown in the diagram of FIG. 4 represents the relation between the quantity of light incident on a G (green) pixel in an ordinary Bayer array and the magnitude of a signal output by the G pixel due to the light incident to the G pixel.

As shown in the diagram of FIG. 4, it is desirable to set the sensitivity of the S1 pixel at a value higher than the sensitivity of the G pixel but set the sensitivity of the S2 pixel at a value lower than the sensitivity of the G pixel.

To put it more concretely, if the sensitivity of a pixel with a filter not absorbing light in the visible light region or a pixel with no filter is assumed to have a value of 100, the sensitivity of a filter having the green filter normally has a value in the range 40 to 60.

That is to say, if the sensitivity of a pixel with a filter not absorbing light in the visible light region or a pixel with no filter is assumed to have a value of 100, the transmittance of the S1 filter is set at such a value that the sensitivity of the S1 pixel normally has a value in the range 40 to 100.

Likewise, if the sensitivity of a pixel with a filter not absorbing light in the visible light region or a pixel with no filter is assumed to have a value of 100, the transmittance of the S2 filter is set at such a value that the sensitivity of the S2 pixel normally has a value which is equal to or lower than 60.

By adjusting the transmittance of the S1 filter to such a value that the sensitivity of the S1 pixel is higher than the sensitivity of the G pixel as shown in the diagram of FIG. 4, it is possible to implement a solid-state imaging device having a sensitivity higher than the sensitivity of a solid-state imaging device which employs G pixels. Thus, in a range of incident light quantities smaller than an incident-light quantity L1 at which the S1 pixel is put at a saturation point, the magnitude of a signal output by the S1 pixel at a particular incident light quantity is greater than the magnitude of a signal output by the ordinary G pixel at the particular incident light quantity. As shown in the diagram of FIG. 4, however, the dynamic range D1 of the S1 pixel is narrower than the dynamic range D of the ordinary G pixel. By making use of a filter having a spectrum with no absorption for wavelengths of incident light as shown in the diagram of FIG. 3 as the S1 filter, however, the sensitivity of the solid-state imaging device can be utilized entirely so that the sensitivity of the solid-state imaging device can be improved.

For the S2 pixel, on the other hand, the S2 pixel is put at the saturation point at an incident-light quantity L2 which is the upper limit of a range of incident light quantities not causing the S2 pixel to enter a saturation state. The sensitivity of the S2 pixel is lower than the sensitivity of the G pixel however, the incident-light quantity L2 corresponding to the saturation point is greater than the incident-light quantity L at which the ordinary G pixel is put at the saturation point. That is to say, the dynamic range D2 of the S2 pixel can be increased to a value greater than the dynamic range D of the ordinary G pixel.

Figure 5:
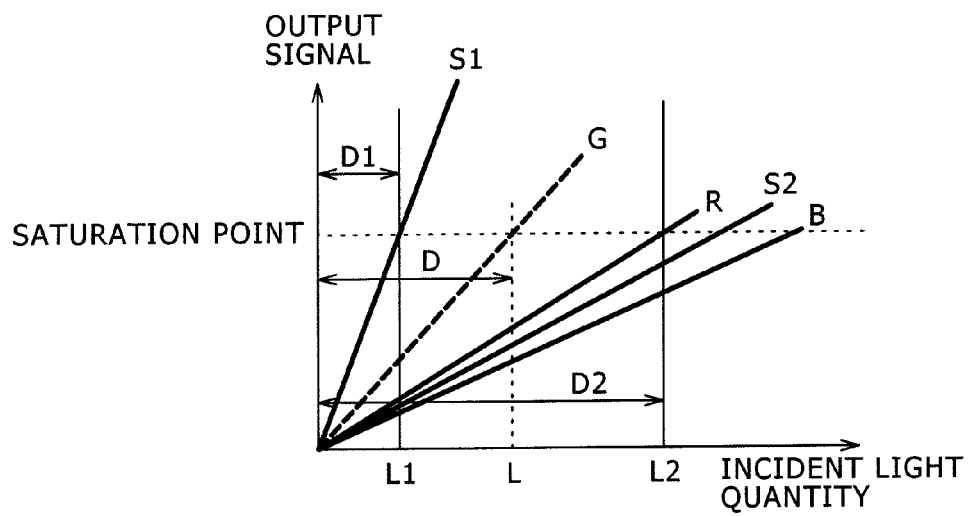
FIG. 5 is a diagram showing relations between the quantity of light incident on each pixel of the solid-state imaging device provided by embodiments of the present invention and the magnitude of a signal output by the pixel as well as relations between the saturation point and the dynamic range.

If the sensitivity of the S2 pixel is set at a value lower than the higher sensitivity of the sensitivities of the R and B pixels, the dynamic range D2 of the S2 pixel can be increased to an even larger value. Unlike the diagram of FIG. 4, however, FIG. 5 shows relations for a case in which the sensitivity of the S2 pixel is set at a value which is lower than the sensitivity of the R pixel but higher than the sensitivity of the B pixel. In this case, an incident-light quantity L2 corresponding to the saturation point in the R pixel can be used as the dynamic range D2 of the R, B and S2 pixels. Thus, the dynamic range D2 of the configuration shown in the diagram of FIG. 5 is wider than the dynamic range D2 of the configuration shown in the diagram of FIG. 4.

If the sensitivity of the S2 pixel is set at a value lower than the higher sensitivity of the sensitivities of the R and B pixels as described above, the incident-light quantity L2 corresponding to the saturation point and the dynamic range D2 having the incident-light quantity L2 used as the upper limit thereof are determined by the higher sensitivity of the R and B pixels.

It is to be noted that the magnitude relation between the sensitivities of the R and B pixels is determined arbitrarily by the spectral sensitivity characteristics of the filters mounted on the image sensor and the spectral sensitivity characteristics of filters other than the filters mounted on the image sensor. That is to say, the magnitude relation between the sensitivities of the R and B pixels is by no means limited to the relations shown in the diagrams of FIGS. 4 and 5 as the relations between the sensitivities of the R and B pixels.

In addition, the sensitivity of the S2 pixel itself can be set at any value as long as the value is lower than the sensitivity of the S1 pixel. If the sensitivity of the S2 pixel is set at a value higher than the sensitivities of the R and B pixels as is the case with the configuration shown in the diagram of FIG. 4, the incident-light quantity L2 corresponding to the saturation point and the dynamic range D2 having the incident-light quantity L2 used as the upper limit thereof are determined by the sensitivity of the S2 pixel. If the sensitivity of the S2 pixel is set at a value lower than the higher sensitivity of the sensitivities of the R and B pixels, on the other hand, the incident-light quantity L2 corresponding to the saturation point and the dynamic range D2 having the incident-light quantity L2 used as the upper limit thereof are determined by the higher sensitivity of the R and B pixels. That is to say, there is no limitation imposed on the relation between the sensitivity of the S2 pixel and the lower sensitivity of the sensitivities of the R and B pixels.

Thus, in a solid-state imaging device employing a pixel section having a pixel array including the R, B, S1 and S2 pixels each configured as described above, for incident light quantities smaller than the incident light quantity L1 corresponding to the saturation point in the S1 pixel, an image having a high sensitivity can be obtained by synthesizing signals generated by the S1, R and B pixels. For incident light quantities larger than the incident light quantity L1, it is possible to obtain an image with a wide dynamic range by synthesizing signals generated by the S2, R and B pixels.

Figure 6:
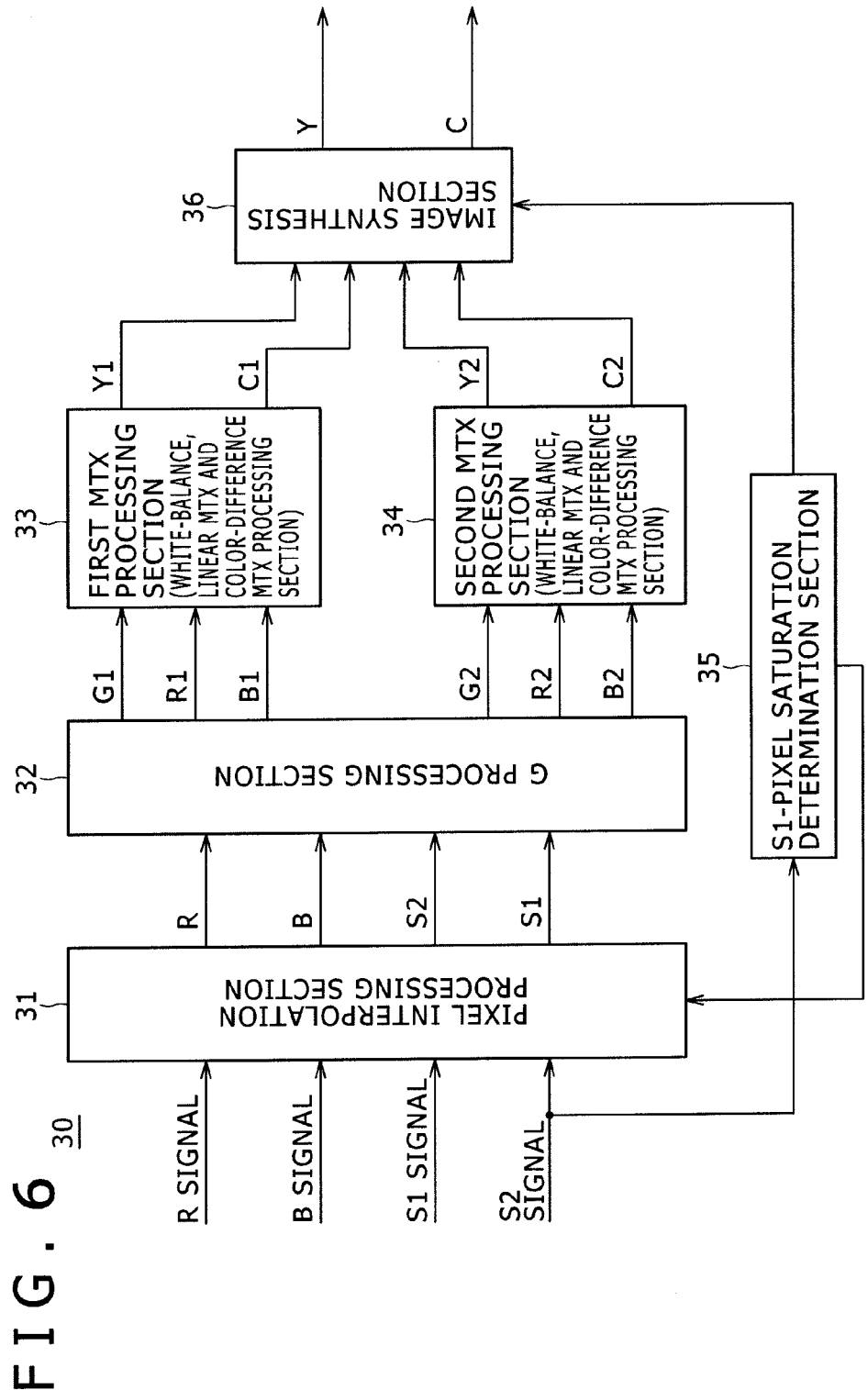
FIG. 6 is a block diagram showing a first embodiment implementing a signal processing circuit employed in the solid-state imaging device provided by embodiments of the present invention.

First Typical Configuration for Implementing Signal Processing to Generate an Image from Pixel Output Signals Next, the following description explains a first embodiment implementing a signal processing circuit 30 for carrying out the signal processing mentioned before in order to generate image luminance signals Y1 and Y2 and image color difference signals C1 and C2 from R, B, S1 and S2 signals output by pixels. FIG. 6 is a block diagram showing the first embodiment implementing the signal processing circuit 30 employed in the solid-state imaging device provided by the present invention. As shown in the figure, the signal processing circuit 30 employs a pixel interpolation processing section 31, a G processing section 32, a first MTX processing section 33, a second MTX processing section 34, a S1-pixel saturation determination section 35 and a pixel synthesis section 36.

First of all, the pixel interpolation processing section 31 receives R, B, S1 and S2 signals generated by the R, B, S1 and S2 pixels respectively. The pixel interpolation processing section 31 then carries out a commonly known interpolation process on the R, B, S1 and S2 signals generated by the R, B, S1 and S2 pixels respectively in order to generate a high-sensitivity neutral signal S1, a low-sensitivity neutral signal S2, a red signal R and a blue signal B which are associated with the R, B, S1 and S2 pixels respectively.

In the array of the R, B, S1 and S2 pixels, each of the filters for the S1 and S2 pixels has a neutral spectrum which is generated by a transmittance not biased in the visible light region. Thus, by multiplication of coefficients, handling equivalent to that of signals output by pixels of the same spectrum is possible.

That is to say, as indicated by the graphs shown in the diagram of FIG. 3, the transmittance of each of the S1 and S2 filters has a fixed value representing visible light absorption which is independent of the wavelength of the light. Let notational denote the ratio of the sensitivity of the S1 pixel to the sensitivity of a pixel having a filter not absorbing visible light at all whereas notation a2 denote the ratio of the sensitivity of the S2 pixel to the sensitivity of the pixel having a filter not absorbing visible light at all. In this case, in accordance with Eq. (1) given below, a signal that can be processed in the same way as the low-sensitivity neutral signal S2 can be generated from the high-sensitivity neutral signal S1. By the same token, in accordance with Eq. (2) given below, a signal that can be processed in the same way as the high-sensitivity neutral signal S1 can be generated from the low-sensitivity neutral signal S2.

$$S1=(S2/a2) \times a1 \tag{1}$$

$$S2=(S1/a1) \times a2 \tag{2}$$

Thus, as shown in the diagram of FIG. 2, there is provided a configuration in which S1 and S2 pixels are placed alternately at the locations of the G pixel in the Bayer array. By virtue of this configuration, it is possible to obtain a resolution equivalent to that of a case, in which a solid-state imaging device based on the Bayer array is used, for a range of incident light quantities not greater than the incident light quantity L1 while having pixels of four types with spectral characteristics different from each other.

In addition, light hitting the S1 pixel as light with an incident light quantity greater than the incident light quantity L1 puts the S1 pixel in a saturated state. It is thus necessary to generate the low-sensitivity neutral signal S2 at the position of the S1 pixel. The low-sensitivity neutral signal S2 at the position of the S1 pixel is generated by carrying an interpolation process which makes use of a signal generated by the S1 pixel in accordance with Eq. (2) given above.

The S1-pixel saturation determination section 35 produces a result of determination as to whether or not the quantity of the light incident on the S1 pixel is greater than the incident light quantity L1.

To put it in detail, a signal output by the S1 pixel is supplied to the pixel interpolation processing section 31 as well as the S1-pixel saturation determination section 35. Then, the S1-pixel saturation determination section 35 examines the signal output by the S1 pixel in order to produce a result of determination as to whether or not the quantity of the light incident on the S1 pixel is greater than the incident light quantity L1 corresponding to the saturation point, that is, in order to produce a result of determination as to whether or not the light incident on the S1 pixel has put the S1 pixel at the saturation point.

If the determination result produced by the S1-pixel saturation determination section 35 indicates that the quantity of the light incident on the S1 pixel is not greater than the incident light quantity L1 corresponding to the saturation point, the S1-pixel saturation determination section 35 requests the pixel interpolation processing section 31 to generate the high-sensitivity neutral signal S1 at the position of the S2 pixel by making use of a signal generated by the S1 pixel. If the determination result produced by the S1-pixel saturation determination section 35 indicates that the quantity of the light incident on the S1 pixel is greater than the incident light quantity L1 corresponding to the saturation point, on the other hand, the S1-pixel saturation determination section 35 requests the pixel interpolation processing section 31 to generate the low-sensitivity neutral signal S2 at the position of the S1 pixel by making use of a signal generated by the S2 pixel.

Then, the G processing section 32 generates a green signal G1, a red signal R1 and a blue signal B1 from the high-sensitivity neutral signal S1, the red signal R and the blue signal B which are received from the pixel interpolation processing section 31. In addition, the G processing section 32 also generates a green signal G2, a red signal R2 and a blue signal B2 from the low-sensitivity neutral signal S2 also received from the pixel interpolation processing section 31, the red signal R and the blue signal B.

As described earlier, the ratio of the sensitivity of the S1 pixel to the sensitivity of a pixel having a filter not absorbing visible light at all is a1 whereas the ratio of the sensitivity of the S2 pixel to the sensitivity of the pixel having a filter not absorbing visible light at all is a2.

In this case, the G processing section 32 generates the green signal G1, the red signal R1 and the blue signal B1, which are signals used for generating a high-sensitivity image, from the high-sensitivity neutral signal S1, the red signal R and the blue signal B by making use of the ratio a1 in accordance with Eq. (3) given below. In the same way, the G processing section 32 generates the green signal G2, the red signal R2 and the blue signal B2, which are signals used for generating a low-sensitivity image, from the low-sensitivity neutral signal S2, the red signal R and the blue signal B by making use of the ratio a2 in accordance with Eq. (4) given as follows.

$$G1=S1-a1(R+B), R1=R, B1=B \quad (3)$$

$$G2=S2-a2(R+B), R2=R, B2=B \quad (4)$$

In addition, the G processing section 32 is also capable of generating the green signal G1, the red signal R1 and the blue signal B1, which are signals used for generating a high-sensitivity image, from the high-sensitivity neutral signal S1, the red signal R and the blue signal B by making use of the ratio a1 in accordance with Eq. (5) given below. In the same way, the G processing section 32 is also capable of generating the green signal G2, the red signal R2 and the blue signal B2, which are signals used for generating a low-sensitivity image, from the low-sensitivity neutral signal S2, the red signal R and the blue signal B by making use of the ratio a2 in accordance with Eq. (6) given as follows.

$$G1=(S1/a1)-(R+B), R1=R, B1=B \quad (5)$$

$$G2=(S2/a2)-(R+B), R2=R, B2=B \quad (6)$$

That is to say, the G processing section 32 generates the green signal G1, the red signal R1 and the blue signal B1, which are signals used for generating a high-sensitivity image, in accordance with Eq. (3) or Eq. (5). In the same way, the G processing section 32 generates the green signal G2, the red signal R2 and the blue signal B2, which are signals used for generating a low-sensitivity image in accordance with Eq. (4) or Eq. (6).

Then, the first MTX processing section 33 carries out matrix processes such as a white balance process, a linear matrix process and a color-difference matrix process on the green signal G1, the red signal R1 and the blue signal B1, which are received from the G processing section 32, in order to generate a high-sensitivity image luminance signal Y1 and a high-sensitivity image color difference signal C1. The high-sensitivity image luminance signal Y1 and the high-sensitivity image color difference signal C1 are signals representing a high-sensitivity image corresponding to a high illumination side of a range of incident light quantities smaller than the incident light quantity L1 of light causing the S1 pixel to enter the saturated state as shown in the diagram of FIG. 4.

By the same token, the second MTX processing section 34 carries out matrix processes such as the white balance process, the linear matrix process and the color-difference matrix process on the green signal G2, the red signal R2 and the blue signal B2, which are received from the G processing section 32, in order to generate a low-sensitivity image luminance signal Y2 and a low-sensitivity image color difference signal C2. The low-sensitivity image luminance signal Y2 and the low-sensitivity image color difference signal C2 are signals representing a low-sensitivity image corresponding to a range of incident light quantities greater than the incident light quantity L1 of incident light causing the S1 pixel to enter the saturated state as shown in the diagram of FIG. 4.

Subsequently, the pixel synthesis section 36 synthesizes the high-sensitivity image luminance signal Y1 and the high-sensitivity image color difference signal C1, which have been generated by the first MTX processing section 33 to serve as signals representing the high-sensitivity image, as well as the low-sensitivity image luminance signal Y2 and the low-sensitivity image color difference signal C2, which have been generated by the second MTX processing section 34 to serve as signals representing the low-sensitivity image, in order to generate a final image. At that time, if the S1-pixel saturation determination section 35 has not detected the saturated state of the S1 pixel, the pixel synthesis section 36 generates the final images which are composed of only high-sensitivity images.

If the S1-pixel saturation determination section 35 has detected the saturated state of the S1 pixel, on the other hand, for a pixel with the incident light quantity thereof not greater than the incident light quantity L1, the pixel synthesis section 36 makes use of the high-sensitivity image luminance signal Y1 and the high-sensitivity image color difference signal C1 which represent the high-sensitivity image of the two images, that is, the low-sensitivity image and the high-sensitivity image. For a pixel with the incident light quantity thereof greater than the incident light quantity L1, however, the pixel synthesis section 36 makes use of the low-sensitivity image luminance signal Y2 and the low-sensitivity image color difference signal C2 which represent the low-sensitivity image. As described above, by making use of the high-sensitivity image luminance signal Y1 and the high-sensitivity image color difference signal C1 for a pixel with the incident light quantity thereof not greater than the incident light quantity L1, the pixel synthesis section 36 generates the final image as a synthesized image of only high-sensitivity images. By the same token, by making use of the low-sensitivity image luminance signal Y2 and the low-sensitivity image color difference signal C2 for a pixel with the incident light quantity thereof greater than the incident light quantity L1, the pixel synthesis section 36 generates the final image as a synthesized image of only low-sensitivity images.

If the pixel synthesis section 36 switches the high-sensitivity image luminance signal and the high-sensitivity image color difference signal from the high-sensitivity image luminance signal Y1 and the high-sensitivity image color difference signal C1 for a pixel with the incident light quantity thereof not greater than the incident light quantity L1 to the low-sensitivity image luminance signal Y2 and the low-sensitivity image color difference signal C2 for a pixel with the incident light quantity thereof greater than the incident light quantity L1 or vice versa, the synthesized image undesirably becomes unnatural. In order to solve this problem, one of a variety of commonly known methods is selected to serve as a method for generating a natural image. For example, the synthesis ratio of signals representing images being synthesized is changed to a value according to the incident light quantity.

Figure 7:
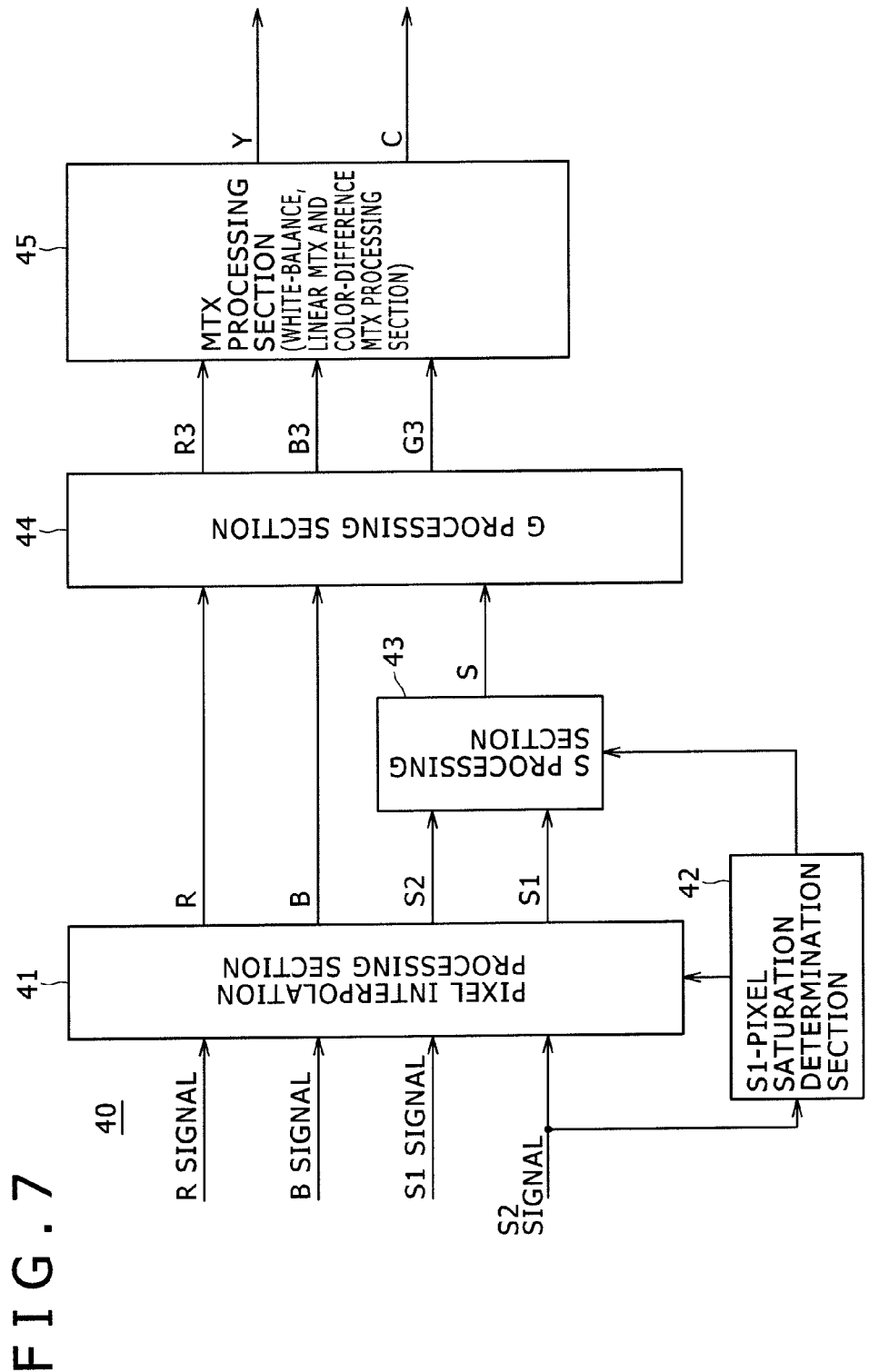
FIG. 7 is a block diagram showing a second embodiment implementing a signal processing circuit employed in the solid-state imaging device provided by embodiments of the present invention.

Second Typical Configuration for Implementing Signal Processing to Generate an Image From Pixel Output Signals Next, the following description explains a second embodiment implementing a signal processing circuit 40 for carrying out signal processing mentioned before in order to generate an image luminance signal Y and an image color difference signal C from signals output by pixels. FIG. 7 is a block diagram showing the second embodiment implementing the signal processing circuit 40 employed in the solid-state imaging device provided by the present embodiments. As shown in the figure, the signal processing circuit 40 employs a pixel interpolation processing section 41, an S1-pixel saturation determination section 42, an S processing section 43, a G processing section 44 and an MTX processing section 45.

First of all, in the same way as the first embodiment implementing the signal processing circuit 30 as described above, the pixel interpolation processing section 41 receives R, B, S1 and S2 signals generated by the R, B, S1 and S2 pixels respectively. The pixel interpolation processing section 41 then carries out a commonly known interpolation process on the R, B, S1 and S2 signals generated by the R, B, S1 and S2 pixels respectively in order to generate a high-sensitivity neutral signal S1, a low-sensitivity neutral signal S2, a red signal R and a blue signal B which are associated with the R, B, S1 and S2 pixels respectively. The pixel interpolation processing section 41 employed in the signal processing apparatus according to the second embodiment may carry out the commonly known interpolation process on the R, B, S1 and S2 signals generated by the R, B, S1 and S2 pixels respectively in order to generate a high-sensitivity neutral signal S1, a low-sensitivity neutral signal S2, a red signal R and a blue signal B which are associated with the R, B, S1 and S2 pixels respectively in the same way as the signal processing apparatus 30 according to the first embodiment.

Also in the same way as the signal processing apparatus 30 according to the first embodiment, the S1-pixel saturation determination section 42 produces a result of determination as to whether or not the quantity of the incident light is greater than the incident light quantity L1. If the determination result produced by the S1-pixel saturation determination section 42 indicates that the quantity of the light incident on the S1 pixel is greater than the incident light quantity L1 corresponding to the saturation point, the S1-pixel saturation determination section 42 requests the pixel interpolation processing section 41 to carry out an interpolation process of generating the low-sensitivity neutral signal S2 at the position of the S1 pixel by making use of a signal generated by the S2 pixel.

Then, the S processing section 43 synthesizes the high-sensitivity neutral signal S1 generated by the pixel interpolation processing section 41 and the low-sensitivity neutral signal S2 also supplied by the pixel interpolation processing section 41 in order to generate a synthesized neutral signal S.

At that time, for every pixel, the S1-pixel saturation determination section 42 produces a result of determination as to whether the high-sensitivity neutral signal S1 or the low-sensitivity neutral signal S2 is to be used in the synthesis process.

To put it in detail, for an S1 pixel with the incident light quantity thereof smaller than the incident light quantity L1, that is, for an S1 pixel not put in the saturated state, the high-sensitivity neutral signal S1 is used in the synthesis process. For an S1 pixel with the incident light quantity thereof greater than the incident light quantity L1, that is, for an S1 pixel put in the saturated state, on the other hand, the low-sensitivity neutral signal S2 is used in the synthesis process. For an S1 pixel with the incident light quantity thereof in a range in close proximity to the incident light quantity L1, a ratio provided for the incident light quantity to serve as the synthesis ratio of the high-sensitivity neutral signal S1 to the low-sensitivity neutral signal S2 is properly determined in order to generate a more natural synthesized image.

Then, the G processing section 44 generates a green signal G3, a red signal R3 and a blue signal B3 from the neutral signal S generated by the S processing section 43 as well as the red signal R and the blue signal B which are generated by the pixel interpolation processing section 41.

To put it in detail, the G processing section 44 generates the green signal G3, the red signal R3 and the blue signal B3 in accordance with Eq. (7) or Eq. (8) given below. In these equations, notational denotes the ratio of the sensitivity of the S1 pixel to the sensitivity of a pixel having a filter not absorbing visible light at all.

$$G3 = S - a1(R+B), R3 = R, B3 = B \quad (7)$$

$$G3 = S3/a1 - (R+B), R3 = R, B3 = B \quad (8)$$

Then, the MTX processing section 45 carries out matrix processes such as a white balance process, a linear matrix process and a color-difference matrix process on the green signal G3, the red signal R3 and the blue signal B3, which are received from the G processing section 44, in order to generate an image luminance signal Y and an image color difference signal C.

If the incident light quantity is small, a signal output by the S1 pixel is processed to generate a high-sensitivity image. In addition, by making use of the S2 pixel having a low sensitivity, the dynamic range can be widened to the incident light quantity L2 at which the S2 pixel is put at the saturation point. In this way, even if the quantity of the incident light puts the S1 pixel at the saturation point, the S2 pixel having the S2 filter does not enter the saturated state. By synthesizing signals output by the S1 and S2 pixels through adoption of the method described earlier, it is possible to find an image luminance signal Y and an image color difference signal C which represent one synthesized image.

Since both the S1 and S2 filters provided on the S1 and S2 pixels respectively transmit light of all wavelengths, by multiplication of the coefficients a1 and a2, handling equivalent to that of a signal from a pixel of the same spectrum is possible.

For the reason described above, by alternately placing the S1 and S2 pixels at typically the locations of the G pixels in the Bayer array as shown in the diagram of FIG. 2, it is possible to obtain a resolution equivalent to that of a case, in which a solid-state imaging device based on the Bayer array is used, while having pixels of four types with spectral characteristics different from each other.

In addition, by providing the S1 and S2 pixels, it is possible to obtain a high-sensitivity image and a low-sensitivity image without reducing the resolution to a level lower than that of a solid-state imaging device which employs the existing Bayer arrays. On top of that, it is possible to implement a solid-state imaging device capable of providing both a high sensitivity and a wide dynamic range and implement a camera system employing such a solid-state imaging device.

3: Typical Configurations of Electronic Apparatus

The solid-state imaging devices according to the present invention can be employed in electronic apparatus such as a camera and a portable apparatus having an embedded camera. That is to say, it is possible to implement electronic apparatus such as a camera employing the solid-state imaging device, a portable apparatus having an embedded camera employing the solid-state imaging device and other electronic apparatus employing the solid-state imaging device.

Figure 8:
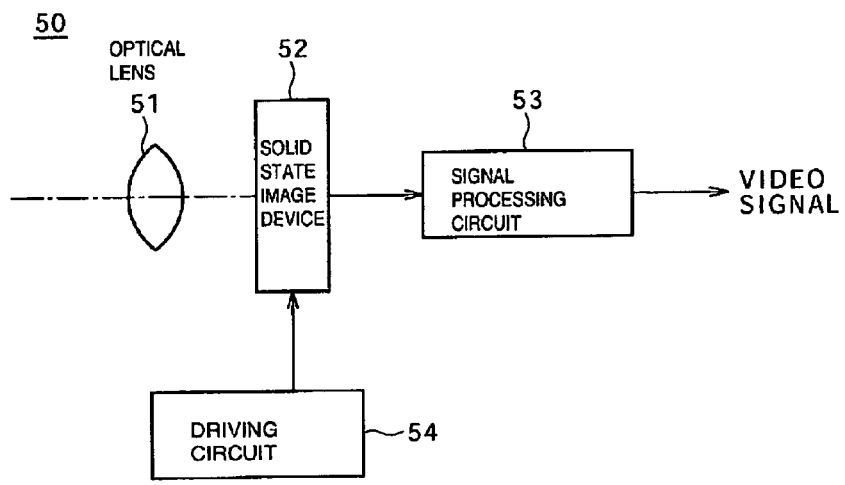
FIG. 8 is a block diagram showing a rough configuration of an electronic apparatus provided by embodiments of the present invention.
Figure 9:
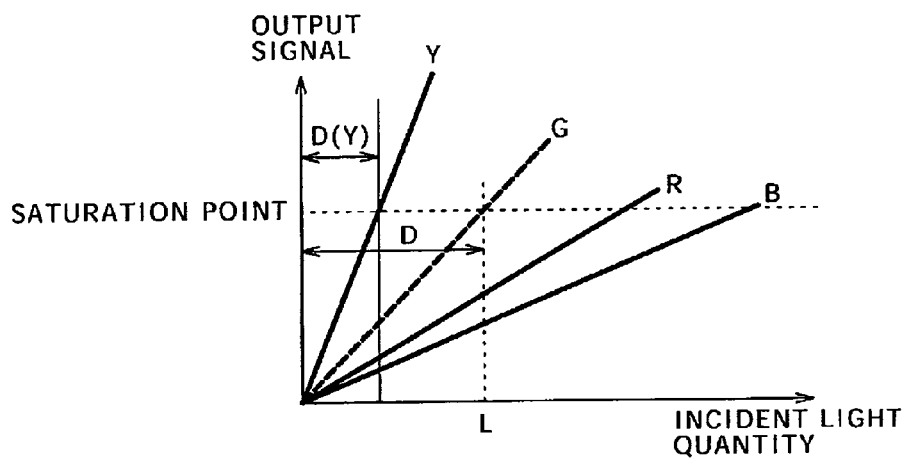
FIG. 9 is a diagram showing relations between the quantity of light incident on each pixel of the existing solid-state imaging device and the magnitude of a signal output by the pixel as well as relations between the saturation point and the dynamic range.

FIG. 8 is a block diagram showing a rough configuration of an electronic apparatus provided by the present invention. To be more specific, FIG. 8 is a block diagram showing a rough configuration of a digital still camera 50 which is capable of taking a still image by virtue of a solid-state imaging device 52 employed in the digital still camera.

As shown in the block diagram, the digital still camera 50 employs an optical lens 51, the solid-state imaging device 52, a signal processing circuit 53 and a driving circuit 54. The optical lens 51 serves as an optical system in the camera 50.

The solid-state imaging device 52 is the solid-state imaging device provided by the present invention as described so far. The optical lens 51 is an optical system for creating an image on an image creation surface in the solid-state imaging device 52 on the basis of image light which comes from an object of photographing to serve as incident light. Thus, during a certain period, signal charge is accumulated in an opto-electrical conversion element which is employed in the solid-state imaging device 52. The driving circuit 54 is a section for supplying a transfer operation signal also referred to as a driving signal or a timing signal to the solid-state imaging device 52. The driving signal generated by the driving circuit 54 transfers a signal output by the opto-electrical conversion element employed in the solid-state imaging device 52 to the signal processing circuit 53. The signal processing circuit 53 is a section for carrying out various kinds of signal processing on the signal output by the opto-electrical conversion element employed in the solid-state imaging device 52. The signal processing circuit 53 is typically the signal processing circuit 30 shown in the block diagram of FIG. 6 or the signal processing circuit 40 shown in the block diagram of FIG. 7. A signal generated by the signal processing circuit 53 as a result of the signal processing is stored in a storage medium such as a memory and output to typically a monitor. Embodiments implementing the digital still camera 50 include a camera module in which each of the optical lens 51, the solid-state imaging device 52, the signal processing circuit 53 and the driving circuit 54 is modularized.

The present invention can be applied to a portable apparatus having an embedded camera such as the digital still camera 50 shown in the block diagram of FIG. 8 or the camera module described above. A representative example of the portable apparatus is a portable phone.

In addition, the configuration shown in the block diagram of FIG. 8 can be implemented as the so-called imaging function module. In the case of the digital still camera 50 shown in the block diagram of FIG. 8, the so-called imaging function module is a module in which each of the optical lens 51, the solid-state imaging device 52, the signal processing circuit 53 and the driving circuit 54 is modularized to implement imaging functions. That is to say, the present embodiments can be applied to an electronic apparatus which employs such an imaging function module.

In the embodiments described so far, a CMOS image sensor is implemented to serve as a typical solid-state imaging device. It is to be noted, however, that the present embodiments can also be applied to a solid-state imaging device other than the CMOS image sensor. For example, the present embodiments can also be applied to a solid-state imaging device which is implemented by modifying a color filter array employed in a general-purpose solid-state imaging device. In this case, the general-purpose solid-state imaging device can be any other image sensor such as a CCD (Charge Coupled Device) image sensor or a CMD (Charge Modulation Device) image sensor. That is to say, the imaging method is not taken into consideration.

In addition, the range of systems to which the present embodiments are applied is by no means limited to the camera system such as a still picture camera or a moving picture camera.

It is also worth noting that the scope of the present invention is by no means limited to the configurations of the embodiments described so far. That is to say, the configurations of the embodiments can be changed to a variety of modified versions within a range which does not deviate from essentials of the present invention.

The present application contains subject matter related to that disclosed in Japanese Priority Patent Application JP 2009-214819 filed in the Japan Patent Office on Sep. 16, 2009, the entire content of which is hereby incorporated by reference.

What is claimed is:

1. A solid-state imaging device comprising:
an R pixel provided with an R filter for transmitting red-color light;
a B pixel provided with a B filter for transmitting blue-color light;
an S1 pixel which is provided with an S1 filter with a visible light transmittance independent of wavelengths in a visible light region across red, green and blue wavelengths and has a sensitivity higher than that of said R pixel; and
an S2 pixel which is provided with an S2 filter with a visible light transmittance independent of wavelengths in said visible light region across red, green and blue wavelengths and a transmittance that is lower than the visible light transmittance of said S1 filter and has a sensitivity lower than the sensitivity of said S1 pixel, and further wherein filters for the S1 and S2 pixels alone determine a relative sensitivity for these pixels.

2. The solid-state imaging device according to claim 1 wherein the sensitivity of said S1 pixel has a value in the range 40 to 100 on the assumption that the sensitivity of a pixel having no filter is 100.

3. The solid-state imaging device according to claim 1 wherein the sensitivity of said S2 pixel is not greater than 60 on the assumption that the sensitivity of a pixel having no filter is 100.

4. The solid-state imaging device according to claim 1 wherein the sensitivity of said S2 pixel is set at a value lower than the higher sensitivity of the sensitivities of said R and B pixels.

5. The solid-state imaging device according to claim 1 wherein:
an image luminance signal is generated by making use of signals output from said S1 and S2 pixels; and
one image is generated by synthesizing said image luminance signal generated from said S1 pixel with said image luminance signal generated from said S2 pixel.

6. The solid-state imaging device according to claim 1 wherein:
an image luminance signal is generated by making use of signals output by said R, B, S1 and S2 pixels; and
a green signal is generated by making use of a ratio of said signal output by said S1 pixel to a signal output by a pixel having a filter absorbing no light in a visible light region.

7. The solid-state imaging device according to claim 1, wherein a pixel signal saturation determination for the S1 pixels determines which pixels are used for generating the image data.

8. The solid-state imaging device according to claim 1, wherein a green pixel signal is generated based on levels of a corresponding S1 or S2 pixel and R and B pixel data.

9. An electronic apparatus employing:
a solid-state imaging device comprising
an R pixel provided with an R filter for transmitting red-color light;
a B pixel provided with a B filter for transmitting blue-color light;
an S1 pixel which is provided with an S1 filter with a visible light transmittance independent of wavelengths in a visible light region across red, green and blue wavelengths and has a sensitivity higher than that of said R pixel; and
an S2 pixel which is provided with an S2 filter with a visible light transmittance independent of wavelengths in said visible light region across red, green and blue wavelengths and a transmittance that is lower than the visible light transmittance of said S1 filter and has a sensitivity lower than the sensitivity of said S1 pixel;
an optical system for guiding incident light to an imaging section of said solid-state imaging device; and
a signal processing circuit for processing a signal output by said solid-state imaging device, and further wherein filters for the S1 and S2 pixels alone determine a relative sensitivity for these pixels.

10. The electronic apparatus according to claim 7, wherein a pixel signal saturation determination for the S1 pixels determines which pixels are used for generating the image data.

11. The electronic apparatus according to claim 9, wherein a green pixel signal is generated based on levels of a corresponding S1 or S2 pixel and R and B pixel data.

* * * * *